United States Patent [19]
Huang

[11] Patent Number: 6,074,223
[45] Date of Patent: Jun. 13, 2000

[54] COMPACT FLASH CARD HAVING A GROUNDING TAB

[75] Inventor: Wayne Huang, Alhambra, Calif.

[73] Assignee: Hon Hai Precision Ind. Co., Ltd., Taipei Hsien, Taiwan

[21] Appl. No.: 09/283,460

[22] Filed: Apr. 1, 1999

[51] Int. Cl.[7] .................................................. H10R 4/66
[52] U.S. Cl. ........................ 439/95; 439/101; 439/108; 439/188; 439/607; 439/609; 439/946; 439/92; 361/373; 361/799
[58] Field of Search .............................. 439/95, 607, 101, 439/108, 188, 946, 92, 609; 361/373, 799

[56] References Cited

U.S. PATENT DOCUMENTS

| | | | |
|---|---|---|---|
| 4,619,487 | 10/1986 | Brush, Jr. .................................. | 339/14 |
| 5,295,846 | 3/1994 | Sumida et al. .......................... | 439/188 |
| 5,516,299 | 5/1996 | Fukuda et al. .......................... | 439/188 |
| 5,547,397 | 8/1996 | Hirai ....................................... | 439/607 |
| 5,582,525 | 12/1996 | Louwagie et al. ...................... | 439/668 |
| 5,885,100 | 3/1999 | Talend et al. ........................... | 439/490 |
| 5,888,092 | 3/1999 | Chang .................................... | 439/489 |
| 5,934,940 | 8/1999 | Maranto et al. ........................ | 439/607 |
| 5,940,275 | 8/1999 | Laity ...................................... | 361/737 |
| 5,941,725 | 8/1999 | Brennan et al. ........................ | 439/357 |

*Primary Examiner*—Paula Bradley
*Assistant Examiner*—Truc Nguyen
*Attorney, Agent, or Firm*—Wei Te Chung

[57] ABSTRACT

An electrical connector comprises a housing having front and rear faces. A plurality of terminal cells is defined between the front and rear faces and each assembled a terminal therein. Each terminal includes a base portion retained within the terminal passageway and a tail portion extends beyond the rear face. At least a recess is defined in an upper face of the housing in communication with one of the terminal cell. At least an EMI shield assembled to the housing includes a grounding tab extending into the corresponding terminal cell through the recess.

8 Claims, 8 Drawing Sheets

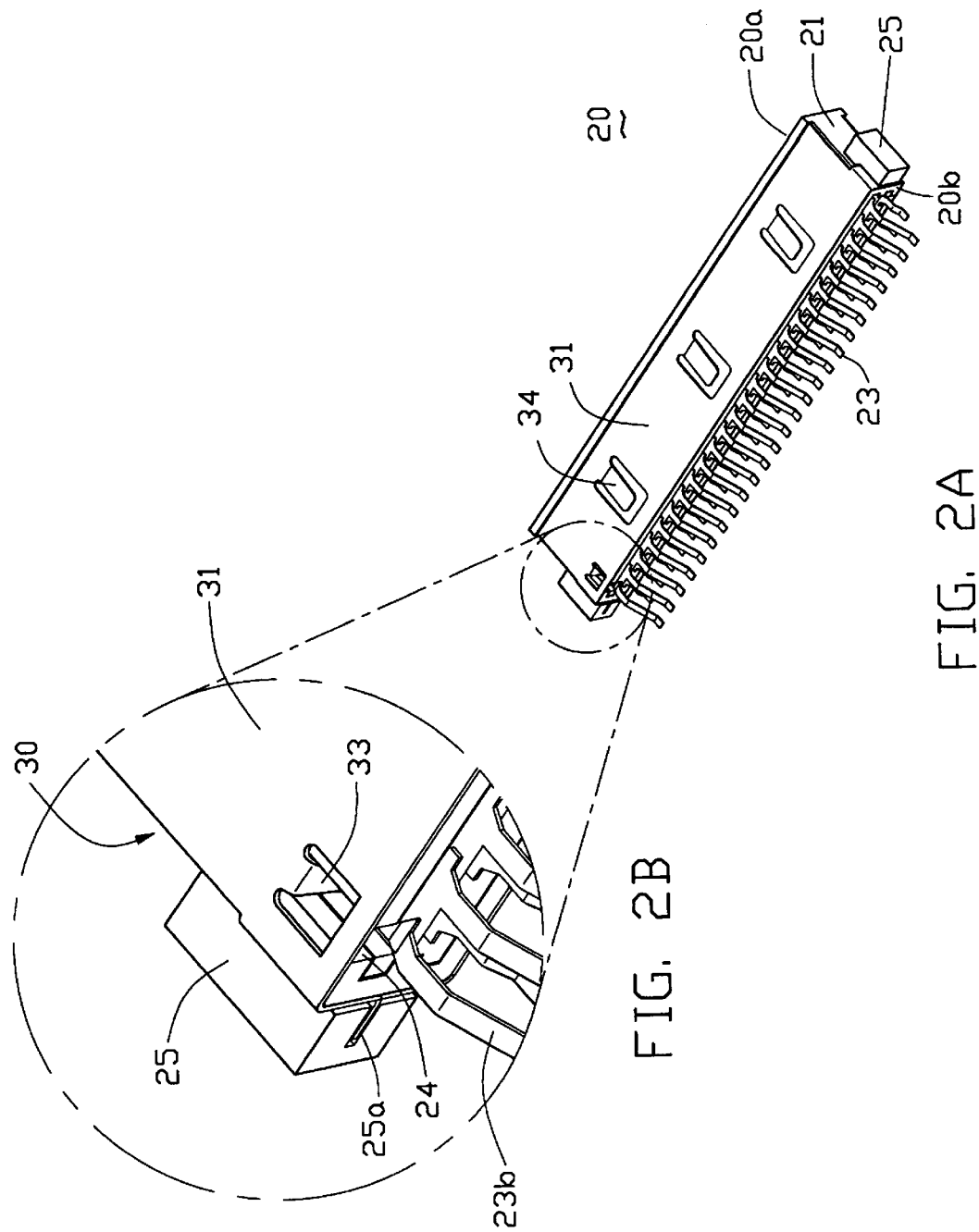

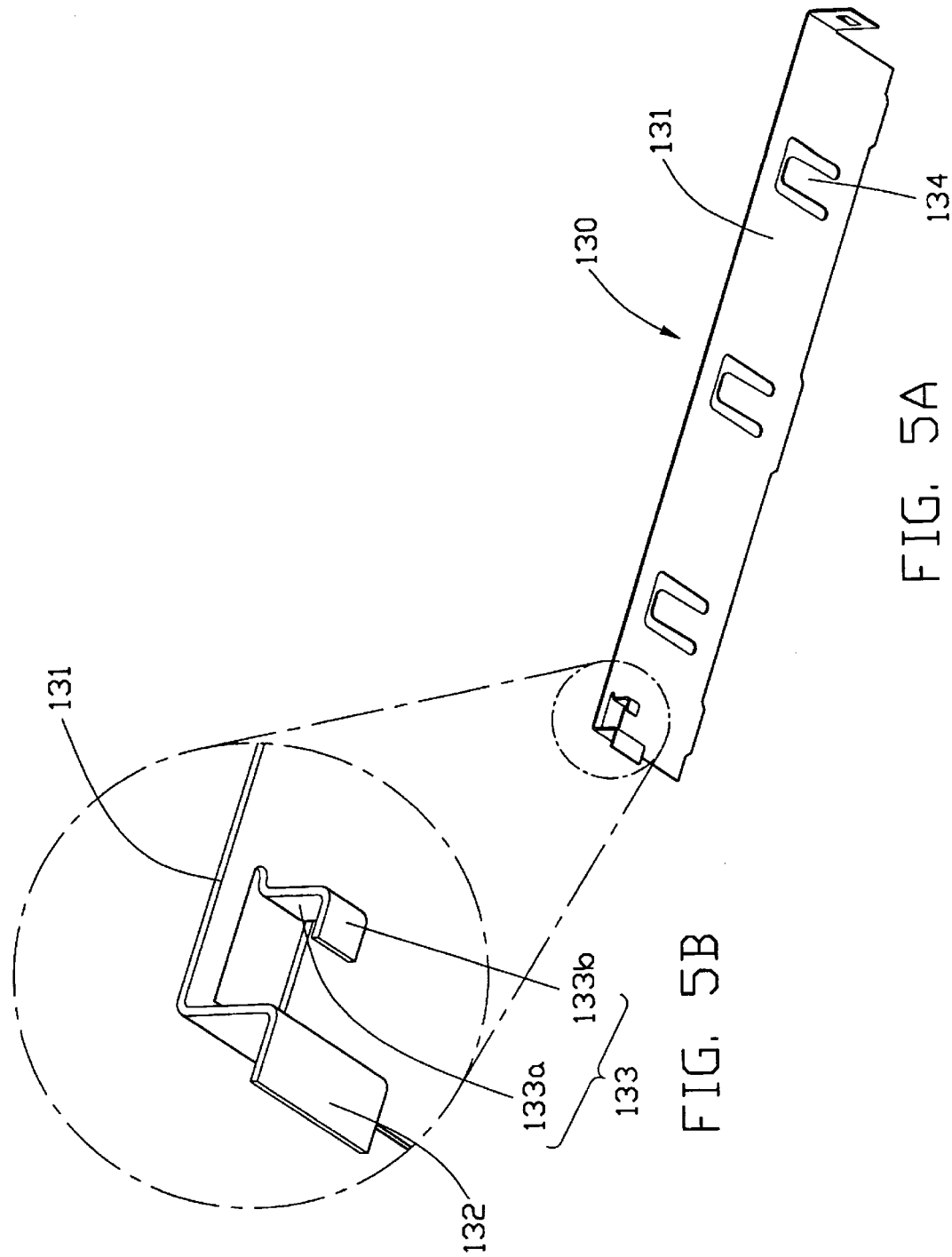

COMPACT FLASH CARD HAVING A GROUNDING TAB

FIELD OF THE INVENTION

The present invention relates to a flash card, and more particularly to a compact flash card having a grounding tab connected to a corresponding terminal within a connector of the card.

DESCRIPTION OF THE PRIOR ART

Memory cards have become increasingly popular for use in notebook, and other computers. Such card typically comprises a rectangular frame with an opening at one side for mounting a connector. A circuit board connected to the connector is assembled within the frame. A problem to such card is the discharge of unwanted charges which negatively affect signal transmissions, especially in high speed signal transmission.

U.S. Pat. No. 5,749,741 discloses a ground connector for utilization with circuit cards and which includes a grounding clip utilized to selectively ground a particular terminal and a substrate ground path to a conductive cover plate of a circuit card. The grounding clip is mounted to one of the terminals assembled in the connector. One of the disadvantages is that it will be laborious to assemble the grounding clip to the selected terminal, especially in such tiny space.

SUMMARY OF THE INVENTION

An objective of this invention is to provide a compact flash card having a grounding tab bridged between a terminal and an electromagnetic interference (EMI) thereto shield assembled to a connector to discharge unwanted charges.

In order to achieve the object set forth, a compact flash card comprises a substrate having a plurality of conductive traces formed thereon. An electrical connector assembled to an edge of the substrate includes a housing having front and rear faces. A plurality of terminal cells is defined between the front and rear faces and each is assembled with a terminal therein. Each terminal includes a base portion retained within the terminal passageway and a tail portion extends beyond the rear face. A recess is formed in an upper face of the housing in communication with one of the terminal cell. A first EMI shield assembled to the connector includes a grounding tab extending into the terminal cell through the recess. A second EMI shield encloses the substrate and the connector and the second EMI shield is electrically connected to the first EMI shield.

These and additional objects, features, and advantages of the present invention will become apparent after reading the following detailed description of the preferred embodiments of the invention taken in conjunction with the appended drawings.

BRIEF DESCRIPTION OF THE DRAWINGS

FIG. 2A is a perspective view of an electrical connector used with the compact flash card;

FIG. 2B is an enlarged view encircled in FIG. 2A;

FIG. 5A is a perspective view of a second embodiment of an EMI shield in accordance with the present invention;

FIG. 5B is an enlarged view encircled in FIG. 5A; and

DETAILED DESCRIPTION OF PREFERRED EMBODIMENT

Figure 1A:
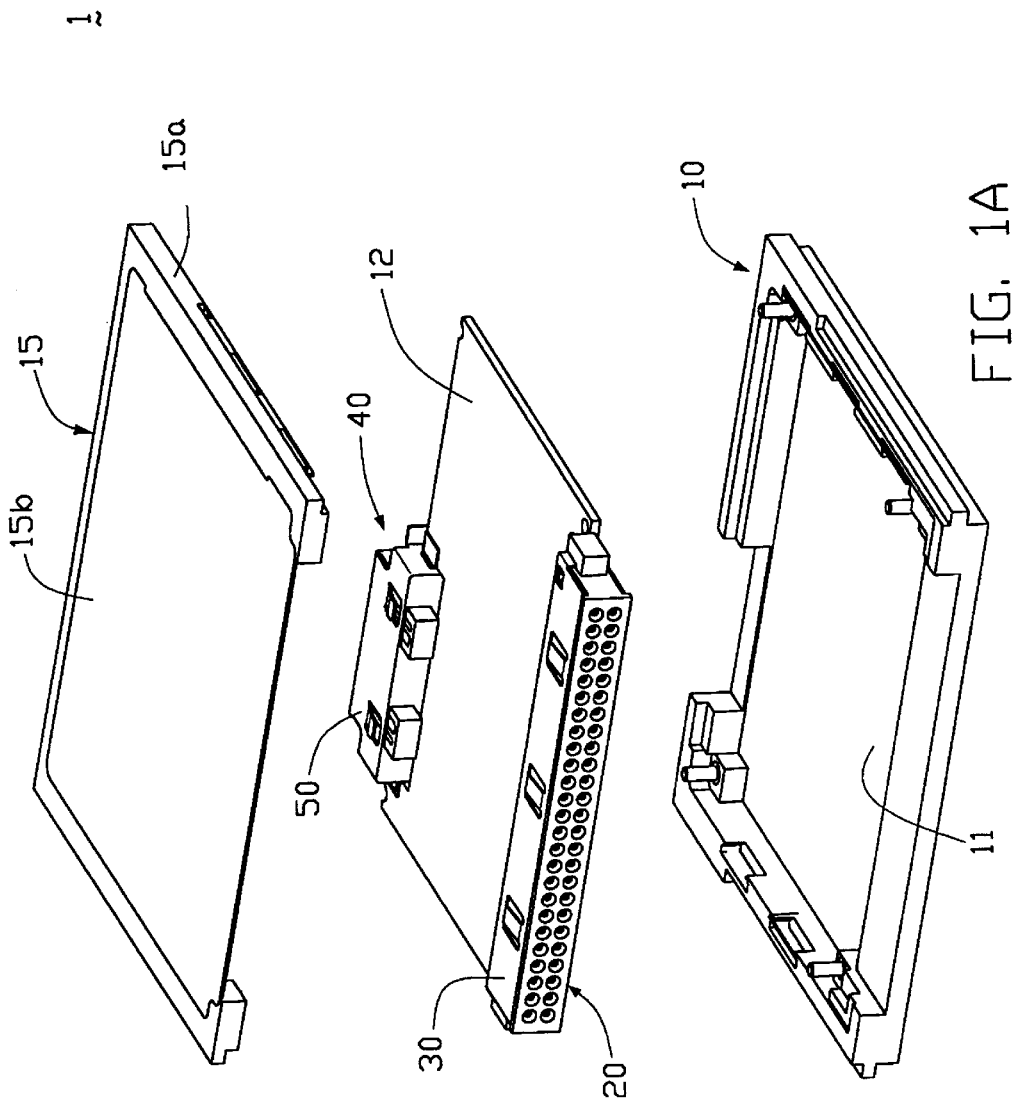
FIG. 1A is a perspective view of a compact flash card in accordance with the present invention.
Figure 1B:
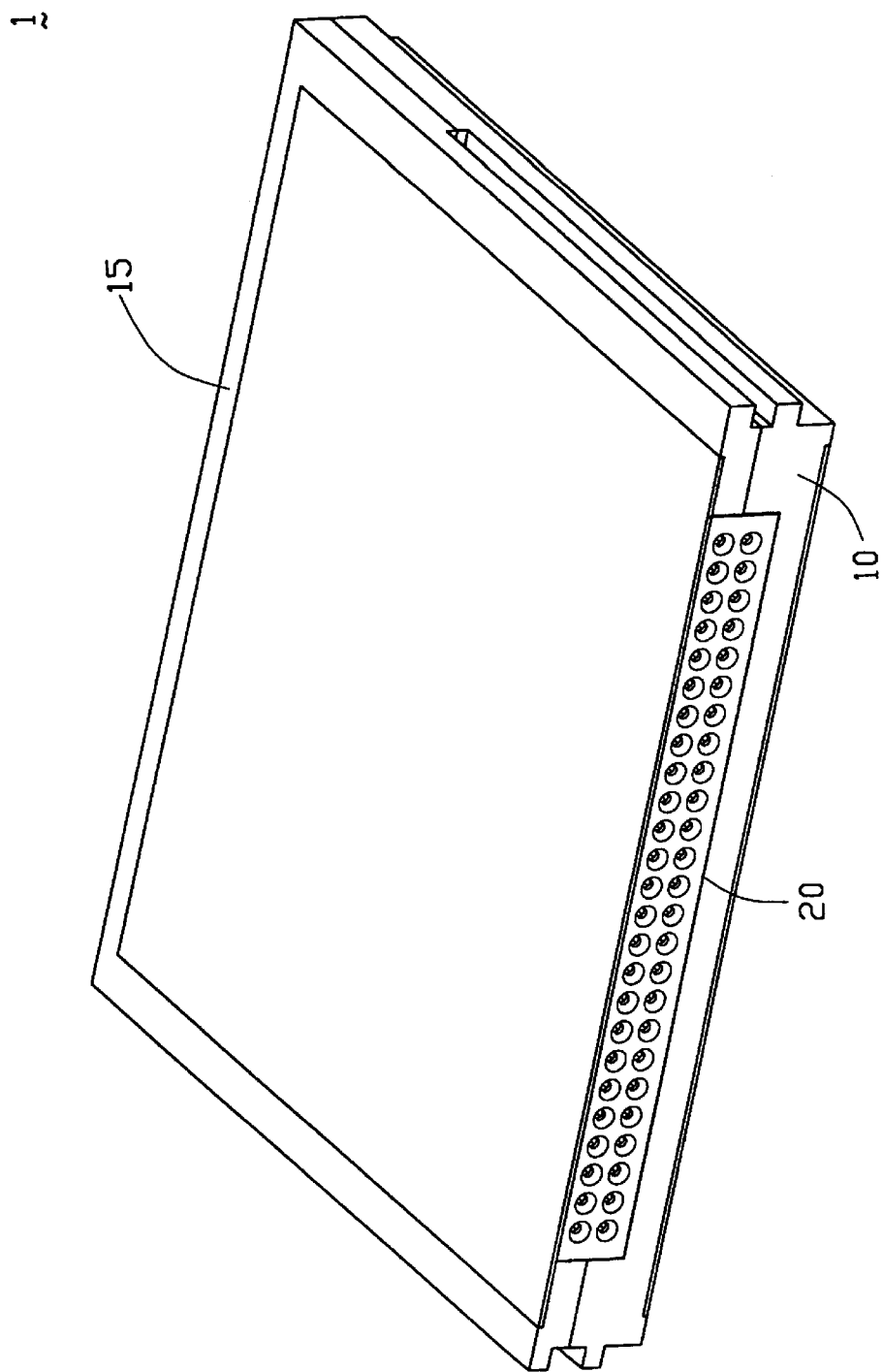
FIG. 1B is an assembled view of FIG. 1A.
Figure 3A:
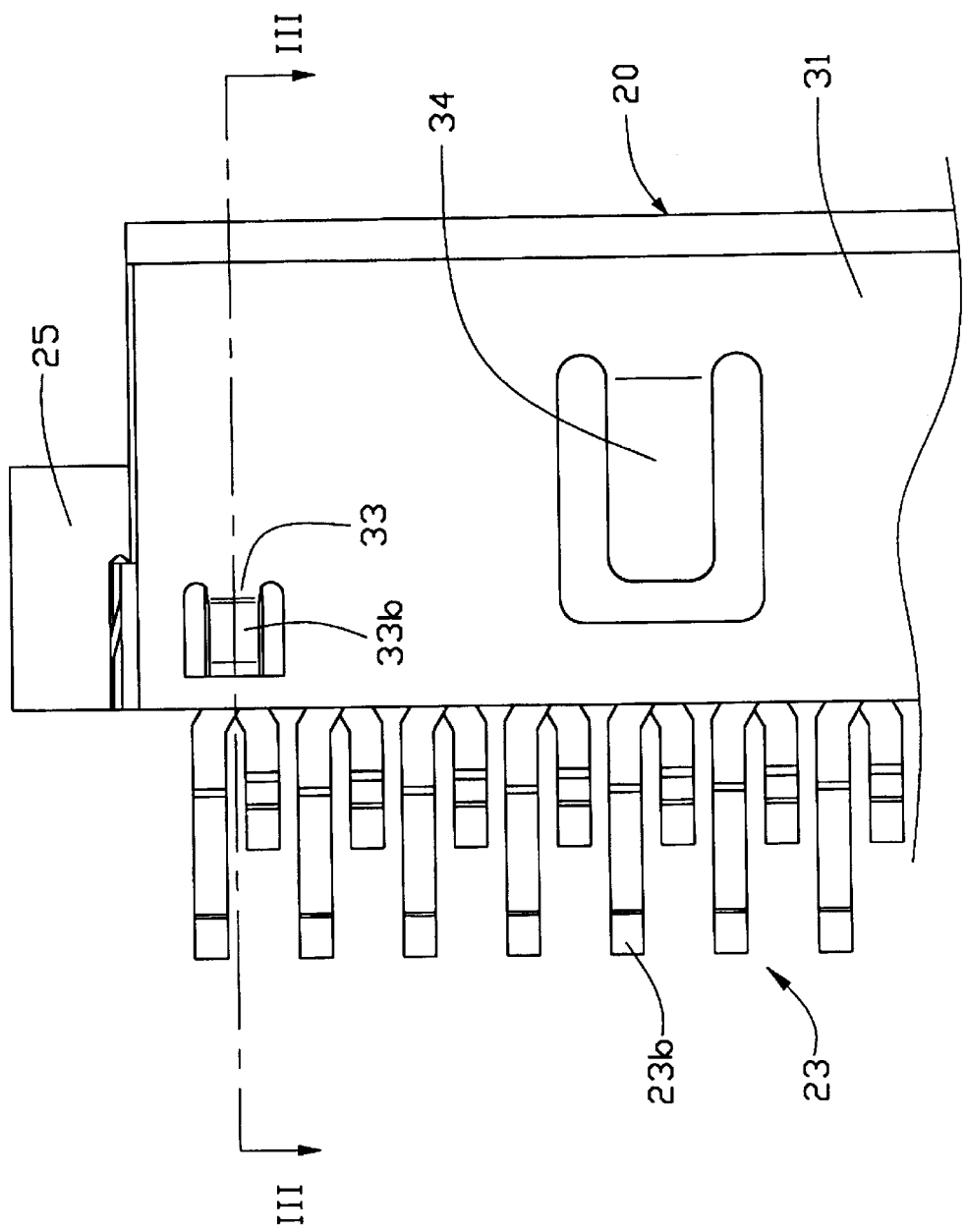
FIG. 3A is a partial, top view of FIG. 2A.
Figures 3B, 3C:
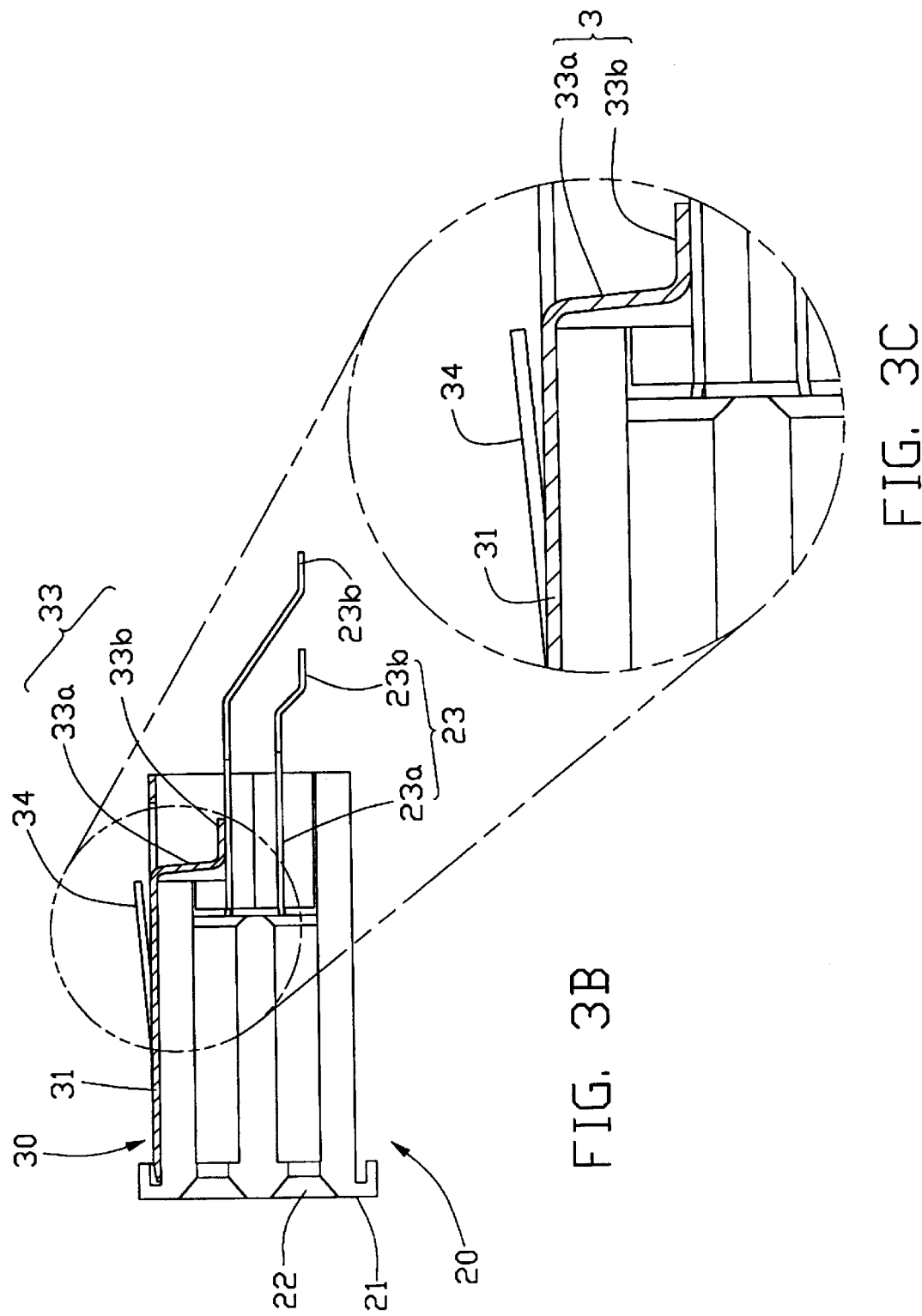
FIG. 3B is a cross sectional view taken along line III—III of FIG. 3A.
FIG. 3C is an enlarged view encircled in FIG. 3B.
Figures 4A, 4B:
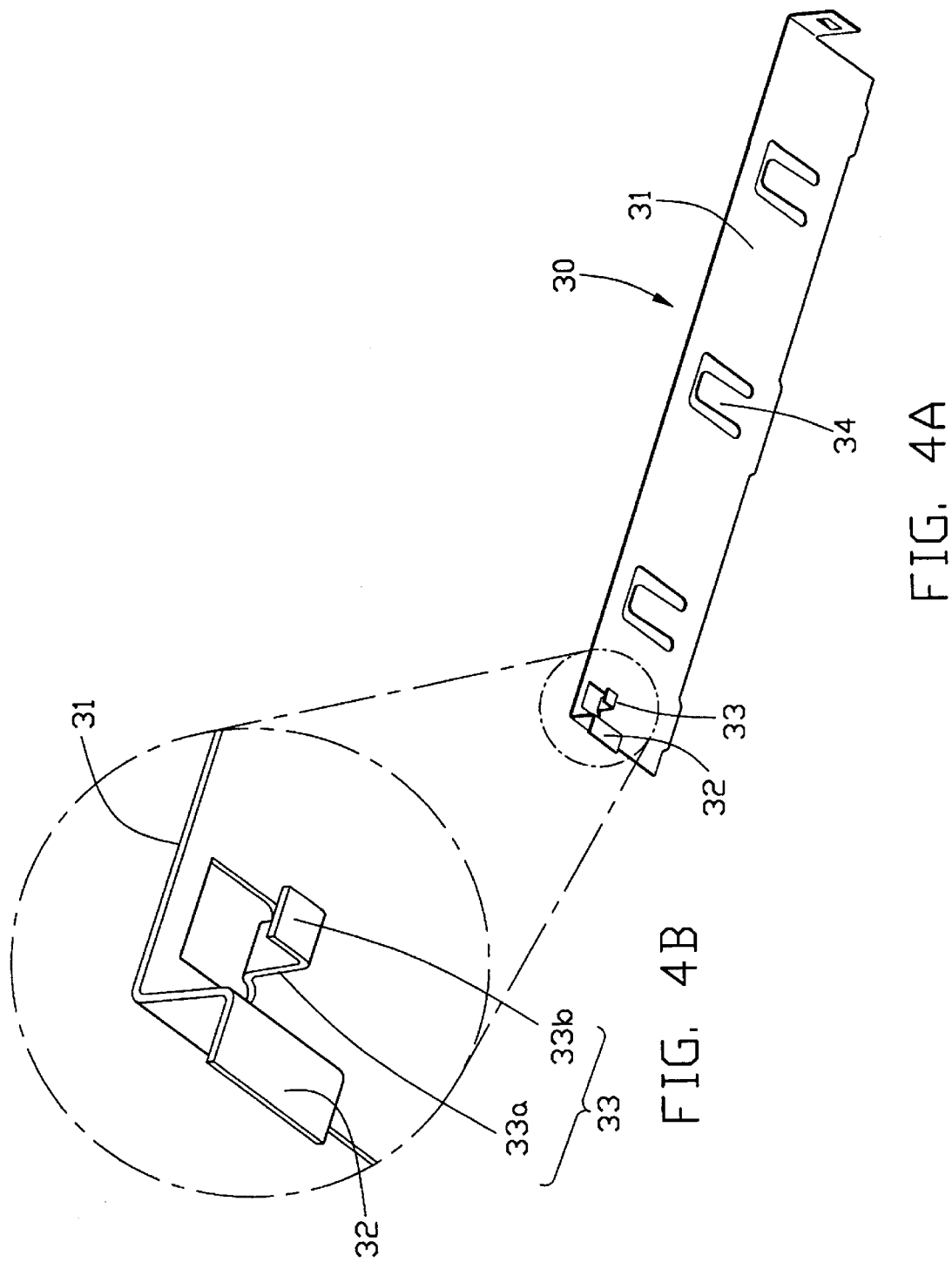
FIG. 4A is a perspective view of an EMI shield viewed from bottom direction.
FIG. 4B is an enlarged view encircled in FIG. 4A.

Referring to FIGS. 1A and 1B, a compact flash card 1 in accordance with the present invention comprises a base fame 10 providing a receiving recess 11 therein. A substrate 12 having a plurality of conductive traces formed thereon (not shown) is securely disposed therein. A 50-pin connector 20 and a 4-pin connector 40 are assembled to opposite edges of the substrate 12. Two cover 15 but only one shown in FIG. 1A, is assembled to the base frame 11 thereby enclosing the connectors 20, 40 therein. The cover 15 includes a metal sheet 15*b* integrally formed with the flange 15*a*. Each connector 20 (40) is assembled with an EMI shield 30 (50) electrically connected to the metal sheet 15*b* of the cover 15 wherein each shield 30(50) substantially covers most portions of an upper horizontal face of the connector 20(40).

Referring to FIGS. 2A to 3C, the 50-pin connector 20 assembled to the substrate 12 including a housing 21 having front and rear faces 20*a*, 20*b*. A plurality of terminal cells 22 is defined between the front and rear faces 20*a*, 20*b*. A plurality of terminals 23 is assembled into the terminal cells 22. Each terminal 23 includes a base portion 23*a* retained within the terminal passageway 22 and a tail portion 23*b* extending beyond the rear face 20*b*. A recess 24 is defined in an upper face of the housing 21 in communication with one of the terminal cells 22. The housing 21 further includes a pair of blocks 25 integrally formed on opposite end thereof. Each block 25 defines a retaining slot 25*a* in a central portion thereof.

The EMI shield 30 includes a planar portion 31 having a pair of wings 32 at opposite ends. The wing 32 is snugly received within the retaining slot 25*a* when the EMI shield 30 is assembled to the connector 20. A grounding tab 33 extends from the planar portion 31 and into the terminal cell 22 through the recess 24. The grounding tab 33 includes a vertical portion 33*a* and a horizontal portion 33*b* electrically abutting against the corresponding terminal 23 which is electrically connected to a grounding circuit on the substrate 12. In this embodiment, a normal line of the vertical portion 33 is parallel to a longitudinal direction of the terminal 23. The planar portion 31 includes three grounding tangs 34 extending opposite to the grounding tab 33 for electrically abutting against the metal sheet 15*b* of the cover 15.

FIGS. 5A and 5B disclose a second embodiment of an EMI shield 130. The first EMI shield 130 includes a planar portion 131 having a pair of wings 132 at opposite ends. The wing 132 is snugly received within the retaining slot 25*a* when the EMI shield 130 is assembled to the connector 20. A grounding tab 133 extends from the planar portion 131 and into the terminal cell 22 through the recess 24. The grounding tab 133 includes a vertical portion 133*a* and a horizontal portion 133*b* electrically abutting against the corresponding terminal 23. In this embodiment, a normal line of the vertical portion 133*a* is orthogonal to a longitudinal direction of the terminal 23. This benefits a narrow width of the recess 24. The planar portion 131 includes three grounding tangs 134 extending opposite to the grounding tab 133. The grounding tangs 134 electrically abut against the metal sheet 15b of the cover 15.

Figure 6:
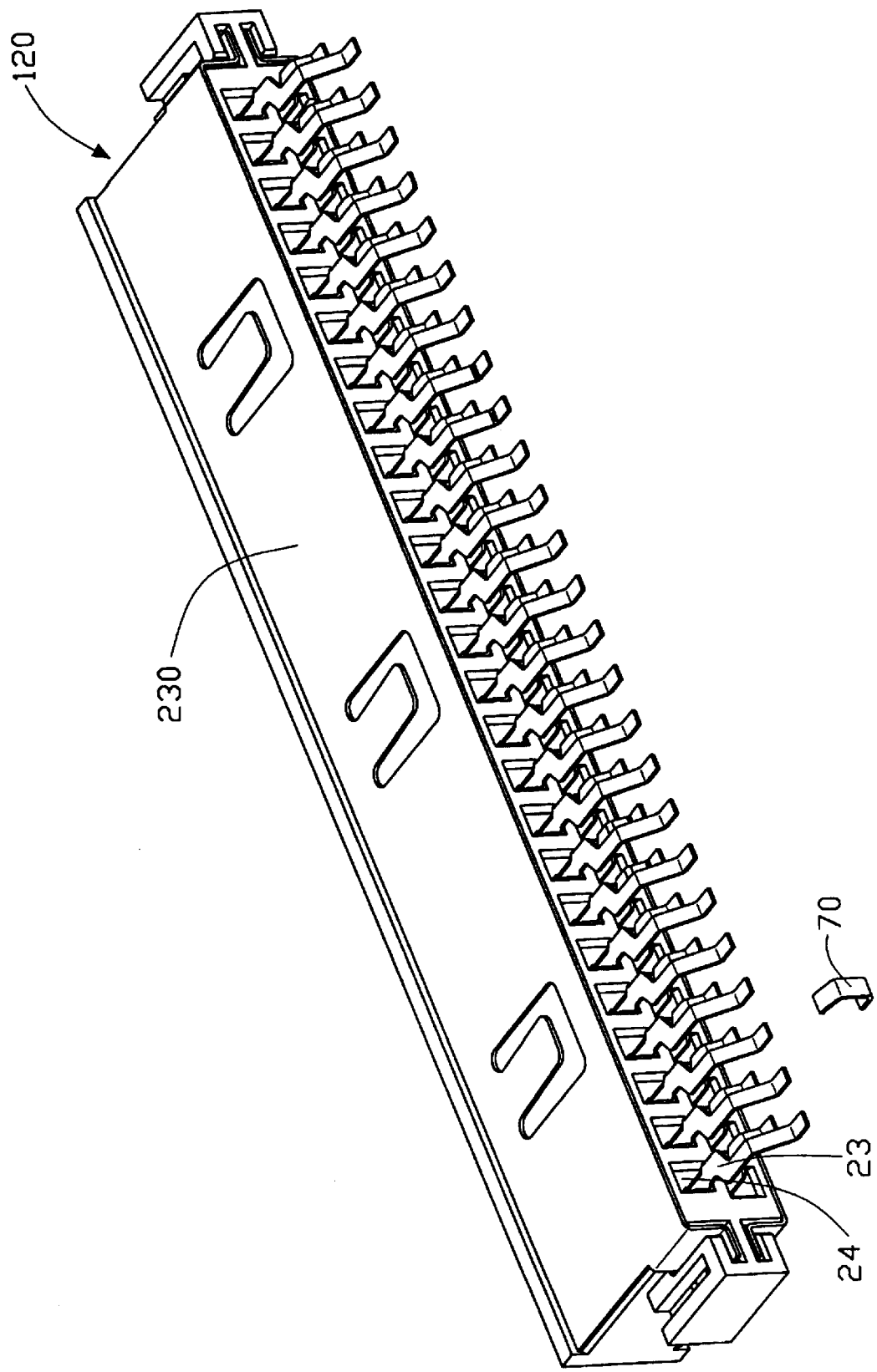
FIG. 6 is another embodiment of a connector in accordance with the present invention.

FIG. 6 discloses another embodiment of a first connector 120. In this embodiment, a grounding tab 70 is separately formed instead of being integrally formed with a third EMI shield 230. After the EMI shield 230 is assembled to the first connector 120, the grounding tab 70 is retainably inserted into the recess 24 thereby electrically bridging the EMI shield 230 and the corresponding terminal 23.

It can be understood that in the invention the grounding path is provided through the EMI shield 30 securely mounted to the housing 21 of the connector 20 with a significantly large area, i.e., substantially covering most portions of an upper horizontal face of the housing 21, thereby not only efficiently preventing in-and-out electromagnetic interference between the connector 20 and the outer circumstance, but also assuring the reliable and sufficient electrical and mechanical engagement with the corresponding cover 15 by means of the grounding tangs 34 which are integrally formed with the shield 30. Under this condition, the grounding path through the cover 15, the EMI shield 30(230), the grounding tab 33(70), the predetermined terminal 23 to the grounding circuit on the substrate 12, can be guaranteed even under vibration.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A compact flash card, comprising:

a substrate having a plurality of conductive traces formed thereon;

an electrical connector assembled to an edge of said substrate, said connector including a housing having front and rear faces, a plurality of terminal cells defined between said front and rear faces, a plurality of terminals assembled into said terminal cells, each terminal including a base portion retained within said terminal cells and a tail portion extending beyond said rear face;

an EMI shield assembled to said connector and covering substantially all of an upper face of the housing, said EMI shield including a grounding tab extending into a predetermined one of said terminal cells and electrically and mechanically engaging therein the corresponding terminal wherein said corresponding terminal is electrically connected to a grounding circuit on the substrate; and a cover enclosing said substrate and said connector, and being electrically connected to said EMI shield.

2. The compact flash card as recited in claim 1, wherein said EMI shield includes a grounding tang extending upward to contact with said cover opposite to said grounding tab extending downward therefrom.

3. A compact flash card comprising:

a substrate having a plurality of conductive traces formed thereon;

an electrical connector assembled to an edge of said substrate, said connector including a housing having front and rear faces, a plurality of terminal cells defined between said front and rear faces, a plurality of terminals respectively assembled into said terminal cells;

an EMI shield secured to the housing of said connector and covering substantially most portion of at least one horizontal face of the housing, a grounding tab extending, around the rear face, into a predetermined one of said terminal cells, and electrically and mechanically coupling therein the corresponding terminal to the EMI shield wherein said corresponding terminal is electrically connected to a grounding circuit on the substrate; and a cover enclosing said substrate and said connector, and being electrically connected to said EMI shield whereby a ground path is established through the cover, the EMI shield, the grounding tab, the predetermined terminal and the grounding circuit.

4. The card as recited in claim 3, wherein said grounding tab extends integrally from the EMI shield.

5. The card as recited in claim 3, wherein a recess is formed in the housing communicatively close to said horizontal face and receives said grounding tab therein.

6. The card as recited in claim 5, wherein said recess retains the grounding tab in position.

7. The card as recited in claim 3, wherein said EMI shield includes a grounding tang integrally extending therefrom an opposite direction with regard to said grounding tab so as to engage the cover and be a part of said grounding path.

8. The card as recited in claim 3, wherein said EMI shield is itself fixed to the housing through at least one wing.

* * * * *